(12) United States Patent
Wada

(10) Patent No.: US 8,274,209 B2
(45) Date of Patent: Sep. 25, 2012

(54) LIGHT EMITTING DEVICE HAVING SEMICONDUCTOR LASER AND FLUORESCENT MATERIAL AND METHOD FOR MANUFACTURING THE SAME

(75) Inventor: Naoki Wada, Ehime-ken (JP)

(73) Assignees: Harison Toshiba Lighting Corp., Ehime (JP); Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 12/725,538

(22) Filed: Mar. 17, 2010

(65) Prior Publication Data
US 2010/0246159 A1 Sep. 30, 2010

(30) Foreign Application Priority Data
Mar. 26, 2009 (JP) .................................. 2009-77312
Jul. 31, 2009 (JP) ................................. 2009-179015

(51) Int. Cl.
*H01L 21/78* (2006.01)
*F21V 9/16* (2006.01)

(52) U.S. Cl. .......... 313/501; 313/498; 313/512; 257/40; 257/269; 362/84

(58) Field of Classification Search .................... 257/40, 257/72, 98–100, 642–643, 759; 313/498–512
See application file for complete search history.

(56) References Cited

U.S. PATENT DOCUMENTS

| 2007/0064755 A1* | 3/2007 | Tanaka et al. ............... 372/43.01 |
| 2008/0169752 A1* | 7/2008 | Hattori et al. .................. 313/503 |
| 2009/0015138 A1* | 1/2009 | Daicho et al. .................. 313/503 |
| 2009/0045426 A1* | 2/2009 | Fehrer et al. ..................... 257/98 |

FOREIGN PATENT DOCUMENTS
JP 2009-010360 A 1/2009
* cited by examiner

*Primary Examiner* — Tracie Y Green
(74) *Attorney, Agent, or Firm* — Pearne & Gordon LLP

(57) ABSTRACT

A light emitting device, includes: a casing; a window; a semiconductor laser provided in an enclosed space formed by the casing and the window; and a fluorescent material in a form of any one of a crystal and glass, the fluorescent material being provided in the enclosed space, the fluorescent material absorbing laser light emitted from the semiconductor laser and emitting secondary light having a wavelength different from a wavelength of the laser light, and the secondary light being taken out through the window.

4 Claims, 7 Drawing Sheets

LIGHT EMITTING DEVICE HAVING SEMICONDUCTOR LASER AND FLUORESCENT MATERIAL AND METHOD FOR MANUFACTURING THE SAME

CROSS-REFERENCE TO RELATED APPLICATIONS

This application is based upon and claims the benefit of priority from the prior Japanese Patent Application No. 2009-77312, filed on Mar. 26, 2009; No. 2009-179015, filed on Jul. 31, 2009; the entire contents of which are incorporated herein by reference.

BACKGROUND

1. Field

Embodiments of the invention relate generally to a light emitting device and a method for manufacturing the same.

2. Description of the Related Art

Light emitting devices for use in lighting, various kinds of display, optical communication, backlights for liquid crystal displays (LCDs), or the like include ones having a structure in which a die of light emitting device such as a light emitting diode (LED) and a phosphor are put in a package made of resin, ceramic, or the like (for example, refer to JP-A 2009-010360 (Kokai)).

As such a light emitting device, a white light emitting diode can be formed in which a phosphor is excited using a die of light emitting device that emits, for example, ultraviolet (UV) to blue light.

However, the excitation of a phosphor with an LED produces low luminous output per light emitting device. Accordingly, the luminous efficiency of the light emitting device is low. On the other hand, in the case where, to avoid such a problem, a high output power semiconductor laser is mounted in a package to excite the phosphor, the phosphor is irradiated with intense light, and impurity gas generates from the phosphor. Such impurity gas causes a degradation of the semiconductor laser and reduces the reliability of the light emitting device.

SUMMARY

According to an aspect of the invention, there is provided a light emitting device, including: a casing; a window; a semiconductor laser provided in an enclosed space formed by the casing and the window; and a fluorescent material in a form of any one of a crystal and glass, the fluorescent material being provided in the enclosed space, the fluorescent material absorbing laser light emitted from the semiconductor laser and emitting secondary light having a wavelength different from a wavelength of the laser light, and the secondary light being taken out through the window.

According to another aspect of the invention, there is provided a light emitting device, including: a casing; a window; and a semiconductor laser provided in an enclosed space formed by the casing and the window, the window including a fluorescent material provided without being exposed to the enclosed space, the fluorescent material absorbing laser light emitted from the semiconductor laser and emitting secondary light having a wavelength different from a wavelength of the laser light, and the secondary light being taken out through the window.

According to still another aspect of the invention, there is provided a light emitting device, including: a semiconductor substrate having a recessed portion formed in a main surface with a first plane orientation, the recessed portion having a side surface with a second plane orientation; a semiconductor laser mounted in the recessed portion; a fluorescent material in a form of any one of a crystal and glass, the fluorescent material being fixed to the main surface of the semiconductor substrate and encapsulating the semiconductor laser in an enclosed space formed in the recessed portion; a first electrode extending on an opposite main surface of the semiconductor substrate from the main surface, the first electrode being connected to one of main electrodes of the semiconductor laser; and a second electrode extending on a side surface of the semiconductor substrate, the second electrode being connected to another one of the main electrodes of the semiconductor laser, the fluorescent material absorbing laser light emitted from the semiconductor laser and reflected by the side surface of the recessed portion and emitting secondary light having a wavelength different from a wavelength of the laser light.

According to still another aspect of the invention, there is provided a method for manufacturing a light emitting device, including: forming a recessed portion in a main surface of a semiconductor substrate, the main surface being with a first plane orientation, the recessed portion having a side surface with a second plane orientation; mounting a semiconductor laser on a bottom surface of the recessed portion; forming a surface electrode on the main surface of the semiconductor substrate and connecting the surface electrode to the semiconductor laser; and bonding a fluorescent material in a form of any one of a crystal and glass to the main surface of the semiconductor substrate to encapsulate the semiconductor laser within the recessed portion.

DETAILED DESCRIPTION

Hereinafter, embodiments of the invention will be described with reference to the drawings.

First Embodiment

Figure 1:
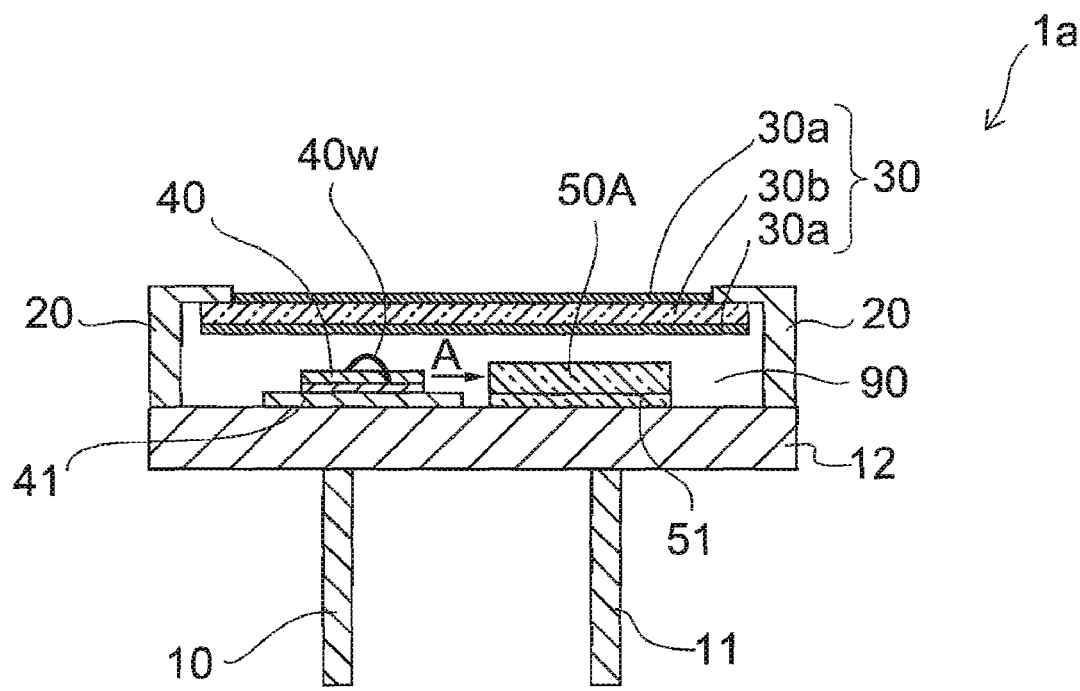
FIG. 1 is a cross-sectional schematic diagram of a principal part of a light emitting device.
Figure 2:
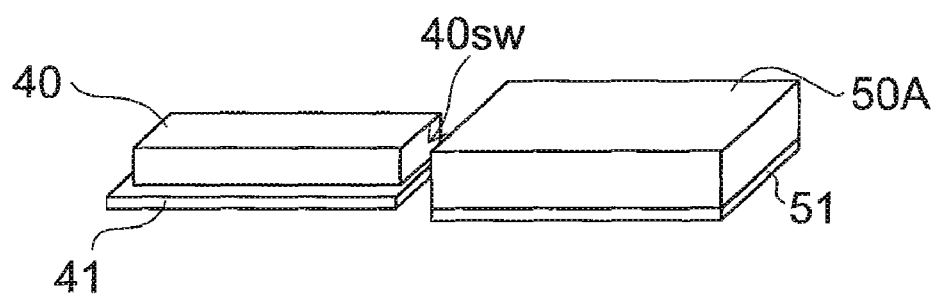
FIG. 2 is a perspective view of the principal part for explaining the positional relationship between a semiconductor laser and a fluorescent material.

FIG. 1 is a cross-sectional schematic diagram of a principal part of a light emitting device. FIG. 2 is a perspective view of the principal part for explaining the positional relationship between a semiconductor laser and a fluorescent material.

A light emitting device 1a has a structure including leads 10 and 11, which are electrodes; a stem (substrate) 12, which is a support base; a package 20 for covering a semiconductor laser and the like; and a window (light exit portion) 30 through which light is taken out. The stem 12 and the package 20 constitute a casing. This casing and the window 30 form an enclosed space. In the light emitting device 1a, a semiconductor laser 40 and a fluorescent material 50A in the form of a block are mounted on the stem 12.

The semiconductor laser 40 is, for example, a laser element consisting primarily of a compound semiconductor or the like, and emits light having a wavelength of 470 nm or less by laser oscillation. Further, a submount layer 41 is interposed between the semiconductor laser 40 and the stem 12. The leads 10 and 11 to serve as external terminals extend from the stem 12 supporting the semiconductor laser 40.

The leads 10 and 11 are insulated from each other. One of the leads 10 and 11 is electrically connected to a lower electrode of the semiconductor laser 40, and the other of the leads 10 and 11 is electrically connected to an upper electrode of the semiconductor laser 40 through a metal wire 40w.

In the light emitting device 1a, the fluorescent material 50A in the form of a block is mounted on the stem 12 to be adjacent to the semiconductor laser 40. Further, a heat sink layer 51 is interposed between the stem 12 and the fluorescent material 50A.

Since the fluorescent material 50A is set adjacent to the semiconductor laser 40, the fluorescent material 50A can be optically excited by laser light (arrow A in the drawing) emitted from a side surface 40sw of the semiconductor laser 40 to emit light having a wavelength different from a wavelength of the laser light. For example, when light of UV, blue-violet, blue, or the like is emitted from the semiconductor laser 40, this light reaches the fluorescent material 50A, and the fluorescent material 50A is excited. Then, the fluorescent material 50A emits secondary light (e.g., visible light or the like) having a wavelength different from a wavelength of the laser light.

In the light emitting device 1a, the window 30 is set to face the side of the stem 12 where the semiconductor laser 40 and the like are mounted. The window 30 is made of, for example, glass, and is transparent to light emitted from the light emitting device 1a. Further, the window 30 has a structure in which main surfaces (upper and lower surfaces) of a transparent base material 30b are sandwiched between nonreflective coat films 30a. Since the nonreflective coat films 30a are formed on the main surfaces, secondary light emitted from the semiconductor laser 40 and the fluorescent material 50A can be efficiently emitted outside the light emitting device 1a without being reflected by the window 30.

The semiconductor laser 40 and the fluorescent material 50A are put in the package 20 and the window 30. A space 90 enclosed by the package 20, the window 30, and the stem 12 is filled with an inert gas such as a rare gas or nitrogen.

The fluorescent material 50A consists primarily of $(Y_XGd_{1-X})(Al_YGa_{1-Y})O_{12}$ ($0 \leq X \leq 1$, $0 \leq Y \leq 1$), for example. The fluorescent material 50A may be made of a fluorescent crystal or fluorescent glass. However, when the fluorescent material 50A is a single crystal, more stable secondary light can be emitted.

The fluorescent material 50A is doped with at least one rare-earth ion selected from divalent europium (Eu), trivalent Eu, trivalent terbium (Tb), trivalent cerium (Ce), and trivalent praseodymium (Pr). In this case, when the above-described laser light is irradiated to the fluorescent material 50A, blue, red, green, and yellow secondary light rays are obtained for divalent Eu, trivalent Eu, trivalent Tb, and trivalent Ce, respectively. It is also possible to produce light of various colors, white light with different color temperatures, and white light with different color rendering by mixing some of these lights.

In particular, in the case where the fluorescent material 50A is a fluorescent single crystal, the fluorescent material 50A is fabricated by the Czochralski crystal growth method or the like. Further, "X" and "Y" in $(Y_XGd_{1-X})(Al_YGa_{1-Y})O_{12}$ are appropriately adjusted in accordance with the ionic radius of the dopant ion.

When the fluorescent material 50A is doped with divalent Eu, the valence of Eu is different from the valence of the mother crystal. Accordingly, to maintain the crystal charge-neutral, the fluorescent material 50A may be doped with tetravalent carbon (C), silicon (Si), germanium (Ge), or in (Sn) at a concentration approximately equal to a concentration of Eu. Further, to adjust the ionic radius, the fluorescent material 50A may also be doped with divalent calcium (Ca), magnesium (Mg), strontium (Sr), or barium (Ba). In this case, the amounts of tetravalent and divalent ions are adjusted to be approximately equal to each other.

In the case where the intensity of the laser light is extremely high even when the fluorescent material 50A is made of a fluorescent crystal or fluorescent glass, the fluorescent material 50A is heated to a high temperature, and the luminous efficiency thereof may decrease. When the temperature of the fluorescent material 50A changes, the emission wavelength of the secondary light thereof changes.

To cope with this, in this embodiment, the heat sink layer 51 with high heat dissipation is interposed between the fluorescent material 50A and the stem 12.

For example, the heat sink layer 51 is made of metal. Such a heat sink layer 51 is formed by vacuum deposition, plasma CVD, plating, or the like. The heat sink layer 51 is desirably made of a material, which has good adhesion to the fluorescent material 50A and which can sufficiently reflect light of the fluorescent material 50A toward the window 30.

For example, the heat sink layer 51 is made of at least one metal selected from platinum (Pt), rhodium (Rh), titanium (Ti), tantalum (Ta), tungsten (W), molybdenum (Mo), chromium (Cr), niobium (Nb), zirconium (Zr), iridium (Ir), silver (Ag), gold (Au), and aluminum (Al), which have linear thermal expansion coefficients close to a linear thermal expansion coefficient of $(Y_XGd_{1-X})(Al_YGa_{1-Y})O_{12}$ and have preferable reflectances.

The heat sink layer 51 formed under the fluorescent material 50A is bonded to a surface of the stem 12 with a lead-free (Pb-free) or eutectic solder.

Since the above-described heat sink layer 51 is formed, the heat of the fluorescent material 50A is efficiently radiated toward the stem 12 even when intense laser light is irradiated to the fluorescent material 50A. Further, since the heat sink layer 51 is made of a metal coating, the laser light is trapped within the fluorescent material 50A by the light reflection effect of the metal coating. Accordingly, the secondary light from the fluorescent material 50A is efficiently emitted in effective directions (e.g., directions toward the window 30).

It should be noted that the leads 10 and 11 are made of, for example, an alloy metal with copper (Cu).

Each of the stem 12 and the package 20 is made of a ceramic such as an alumina or mullite ceramic, a glass ceramic, glass epoxy, paper epoxy, paper phenol, a thermosetting resin, an ultraviolet (UV) curable resin, a thermoplastic resin, or the like.

It should be noted that the stem 12 may be a substrate in the form of a die pad made of the same material as those of the leads 10 and 11.

The submount layer 41 provided under the semiconductor laser 40 is made of, for example, aluminum nitride, which provides high thermal conductivity, high electrical insulation, and the like. Thus, the heat of the semiconductor laser 40 is also efficiently radiated toward the stem 12.

The space 90 of the light emitting device 1a may be in a vacuum state instead of being filled with an inert gas.

The fluorescent material 50A may be set at more than one position. For example, the fluorescent material 50A may be set at positions facing two opposite side surfaces of the semiconductor laser 40.

Thus, in the light emitting device 1a, when a voltage is applied to the leads 10 and 11, the semiconductor laser 40 oscillates to emit laser light having a wavelength of, for example, 470 nm or less. Then, the laser light is irradiated to the fluorescent material 50A adjacent to the semiconductor laser 40, and the fluorescent material 50A emits secondary light having a wavelength different from a wavelength of the laser light. This light is emitted outside the light emitting device 1a through the window 30.

In the light emitting device 1a, the semiconductor laser 40 is used as a die of light emitting device. Thus, light emission (efficient luminous output) per light emitting device is increased compared to the case where a light emitting diode is used as a die of light emitting device.

As the fluorescent material 50A, a fluorescent crystal or fluorescent glass doped with rare-earth ions is used. Accordingly, even when intense laser light is irradiated to the fluorescent material 50A, the aforementioned impurity gas does not generate. This makes the semiconductor laser 40 less prone to degradation.

In particular, in a light emitting device in which a phosphor layer itself is formed on a substrate (e.g., a crystalline substrate or a glass substrate), there are cases where the phosphor layer itself contains impurities and where the phosphor layer contains many defects. Accordingly, a light emitting device including a phosphor layer has a shorter lifetime and a lower luminous efficiency than the light emitting device 1a. Further, since the phosphor layer has a low thermal conductivity, the phosphor layer itself produces heat when intense light such as laser light is irradiated thereto, and therefore the luminous efficiency thereof decreases.

On the other hand, the light emitting device 1a includes the above-described fluorescent material 50A. Since the above-described fluorescent material 50A is made of a fluorescent crystal or fluorescent glass, the fluorescent material 50A contains fewer defects and has a higher thermal conductivity than the phosphor layer. Accordingly, the light emitting device 1a has a long lifetime and a high luminous efficiency.

As described above, as a light emitting device of this embodiment, the light emitting device 1a, which has a high luminous efficiency, high reliability, and a long lifetime, is fabricated.

Second Embodiment

Next, another embodiment of a light emitting device with a high luminous efficiency and high reliability will be described. It should be noted that, in the description below, the same components are denoted by the same reference signs, and detailed description of components described once will be omitted.

Figure 3:
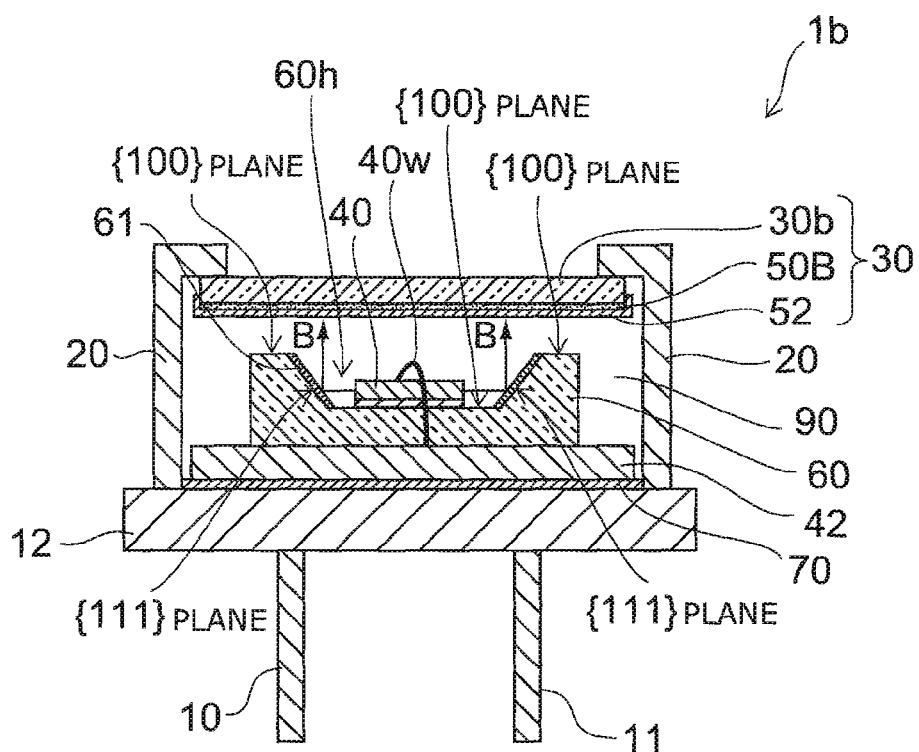
FIG. 3 is a cross-sectional schematic diagram of a principal part of a light emitting device.

FIG. 3 is a cross-sectional schematic diagram of a principal part of a light emitting device.

A light emitting device 1b has a structure including leads 10 and 11, a stem 12, and a package 20. In the light emitting device 1b, a semiconductor laser 40 is provided above the stem 12. Further, a window 30 in which a fluorescent material 50B is formed on a main surface of a transparent base material 30b is set at a position facing the semiconductor laser 40.

Further, a mirror 60 made of, for example, a semiconductor base material is interposed between the semiconductor laser 40 and the stem 12.

The mirror 60 is made of, for example, a silicon crystal. Specifically, a {100} plane of the silicon crystal is etched to form a recessed portion 60h having a {100} plane as a bottom surface and {111} planes as side surfaces. The semiconductor laser 40 is mounted on the bottom surface of the recessed portion 60h.

It should be noted that the etching is performed using a potassium hydroxide (KOH) solution or the like with an etching mask made of a silicon oxide ($SiO_2$) film formed on the {100} plane of the silicon crystal.

On the side surfaces ({111} planes) of the recessed portion 60h, total reflection films 61 are formed. By disposing the total reflection films 61 on the side surfaces ({111} planes) of the above-described recessed portion 60h, laser light from two opposite end faces of the semiconductor laser 40 can be reflected by the total reflection films 61, and the reflected laser light can be irradiated to the fluorescent material 50B (arrow B). In the light emitting device 1b, since mirrors for reflecting the laser light are provided on side surfaces of the recessed portion 60h, the laser light can be efficiently irradiated to the fluorescent material 50B without wasting energy.

Further, a submount layer 42 is interposed between the mirror 60 and the stem 12. The submount layer 42 is fixed to the stem 12 with a lead-free or eutectic solder material. The submount layer 42 is made of the same material as that for the submount layer 41.

The leads 10 and 11 to serve as external terminals extend from the stem 12.

One of the leads 10 and 11 is electrically connected to a lower electrode of the semiconductor laser 40, and the other of the leads 10 and 11 is electrically connected to an upper electrode of the semiconductor laser 40 through a metal wire 40w.

In the light emitting device 1b, the fluorescent material 50B in the form of a layer is formed on a main surface (lower surface) of the transparent base material 30b to face the semiconductor laser 40.

The fluorescent material 50B is formed by coating a fluorescent material on the transparent base material 30b. On a surface (surface exposed to a space 90) and side surfaces of the fluorescent material 50B, at least one coating (surface coat film) 52 selected from a silicon oxide ($SiO_2$) film, a silicon nitride ($Si_3N_4$) film, and a diamond-like carbon (DLC) film is formed. The coating 52 is formed by a CVD (Chemical Vapor Deposition) method. As described above, the light emitting device 1b includes the window 30 including the transparent base material 30b, the fluorescent material 50B, and the coating 52.

When the semiconductor laser 40 emits laser light, the laser light is reflected by the total reflection films 61, and the reflected laser light is irradiated to the fluorescent material 50B. When the fluorescent material 50B absorbs the laser light, the fluorescent material 50B emits secondary light having a wavelength different from a wavelength of the laser light.

Since the fluorescent material 50B is coated with the coating 52, barrier properties of the coating 52 make the fluorescent material 50B hardly emit impurity gas into the space 90 even when the laser light is irradiated to the fluorescent material 50B. Thus, the semiconductor laser 40 in the light emitting device 1b is also less prone to degradation.

It should be noted that, even if a very small amount of impurity gas is emitted into the space 90, such gas is removed (absorbed) by a getter material 70 provided on the stem 12. It should be noted that the getter material 70 may be provided on inner walls of the package 20, instead of on the stem 12. The space 90 may be filled with an inert gas such as a rare gas or nitrogen or may be in a vacuum state.

As described above, the light emitting device 1b includes the above-described fluorescent material 50B. Since such a fluorescent material 50B is protected by a surface coat film (coating 52), the fluorescent material 50B hardly emits impurity gas even when being irradiated with the laser light. Accordingly, the light emitting device 1b has a long lifetime and a high luminous efficiency.

As described above, as a light emitting device of this embodiment, the light emitting device 1b, which has a high luminous efficiency, high reliability, and a long lifetime, is fabricated.

Third Embodiment

Next, still another embodiment of a light emitting device with a high luminous efficiency and high reliability will be described.

Figure 4:
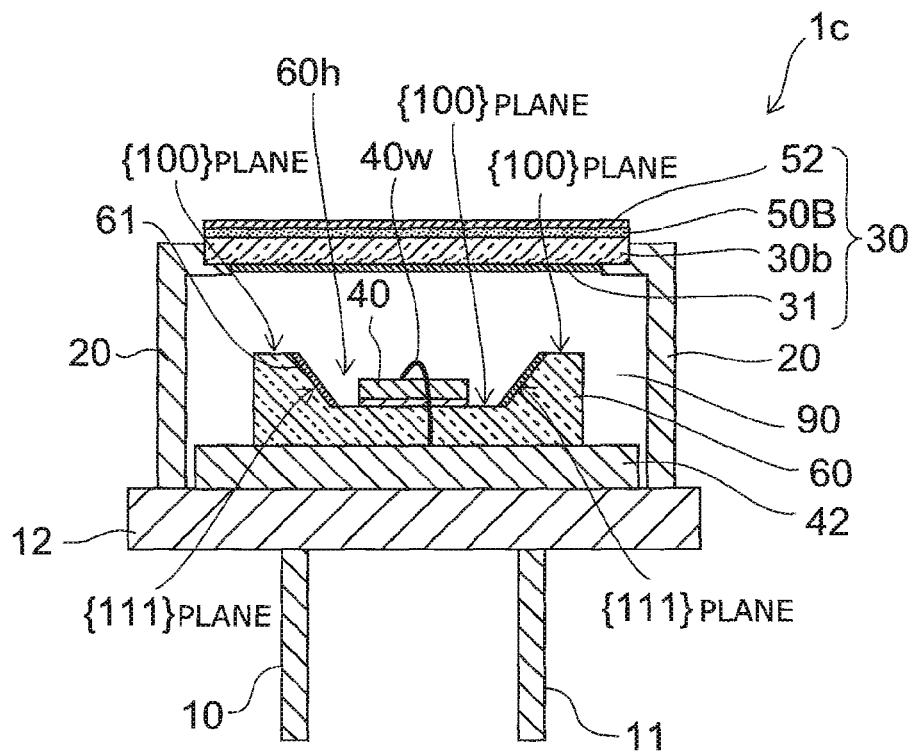
FIG. 4 is a cross-sectional schematic diagram of a principal part of a light emitting device.

FIG. 4 is a cross-sectional schematic diagram of a principal part of a light emitting device.

A light emitting device 1c has the same basic structure as the light emitting device 1b. However, in the light emitting device 1c, the fluorescent material 50B is formed on the upper surface of the transparent base material 30b rather than being provided inside the light emitting device 1c. Further, at least one coating (surface coat film) 52 selected from a silicon oxide ($SiO_2$) film, a silicon nitride ($Si_3N_4$) film, and a diamond-like carbon (DLC) film for covering the fluorescent material 50B is formed. On the space 90 side of the light emitting device 1c, a nonreflective layer 31 is formed on a main surface (lower surface) of the transparent base material 30b. As described above, the light emitting device 1c includes a window 30 including the transparent base material 30b, the fluorescent material 50B, the coating 52, and the nonreflective layer 31.

In the above-described light emitting device 1c, since the fluorescent material 50B is set on the outside of the device, impurity gas is not emitted from the fluorescent material 50B into the space 90 even when the laser light is irradiated to the fluorescent material 50B. Thus, the semiconductor laser 40 in the light emitting device 1c is also less prone to degradation. Since the fluorescent material 50B is protected by the coating 52, the fluorescent material 50B is not directly exposed to outside air and less prone to degradation. Further, since the nonreflective layer 31 is formed on the lower surface of the transparent base material 30b, light can be efficiently taken outside the light emitting device 1c.

Accordingly, the light emitting device 1c also has a high luminous efficiency and high reliability.

Fourth Embodiment

Next, still another embodiment of a light emitting device with a high luminous efficiency and high reliability will be described.

Figure 5:
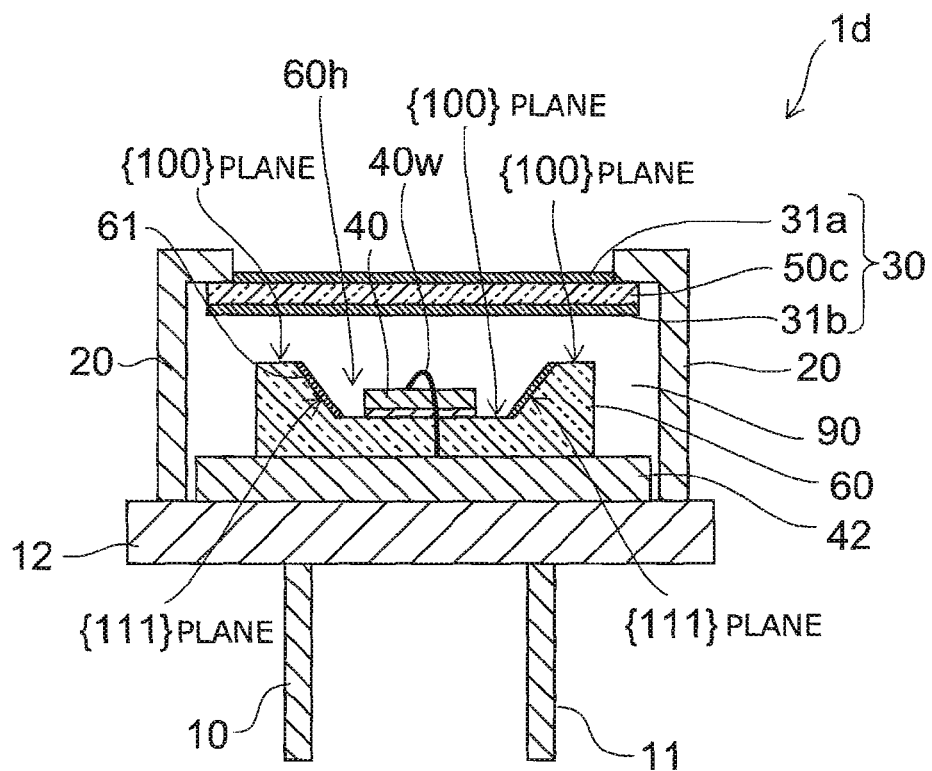
FIG. 5 is a cross-sectional schematic diagram of a principal part of a light emitting device.

FIG. 5 is a cross-sectional schematic diagram of a principal part of a light emitting device.

A light emitting device 1d has the same basic structure as the light emitting device 1b. However, in the light emitting device 1d, a window 50c itself is made of a material such as described above for the fluorescent material 50A. Further, nonreflective layers 31a and 31b are respectively formed on the upper and lower surfaces of the window 50c. Thus, the light emitting device 1d includes a window 30 including the window 50c and the nonreflective layers 31a and 31b.

In the above-described light emitting device 1d, since the window 50c is made of a crystal or glass as the fluorescent material 50A is, the window 50c hardly emits impurity gas into the space 90 even when the laser light is irradiated to the window 50c. Thus, the semiconductor laser 40 in the light emitting device 1d is also less prone to degradation. Further, since the nonreflective layers 31a and 31b are mounted on the upper and lower surfaces of the window 50c, light can be efficiently taken outside the light emitting device 1d.

Accordingly, the light emitting device 1d also has a high luminous efficiency and high reliability.

Fifth Embodiment

Next, still yet another embodiment of a light emitting device with a high luminous efficiency and high reliability will be described.

Figure 6:
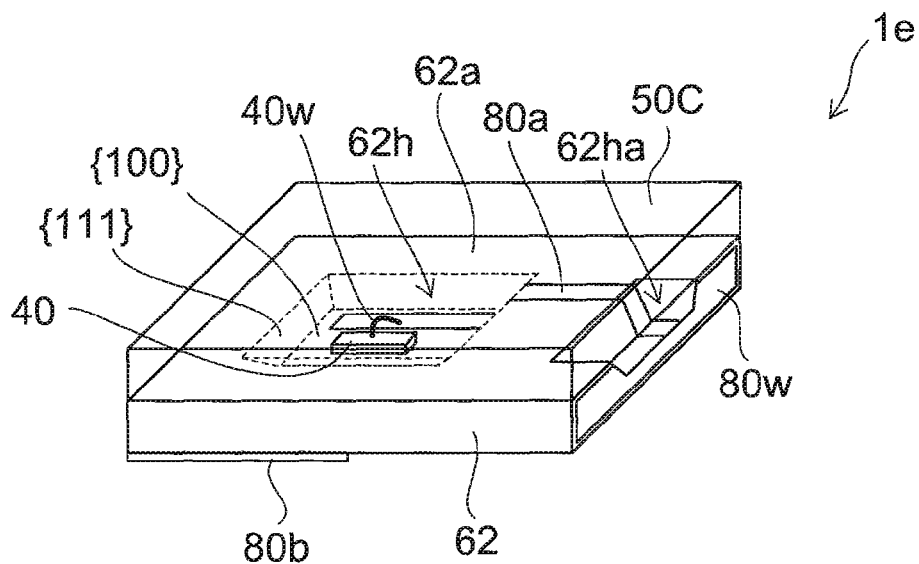
FIG. 6 is a perspective view of a principal part of a light emitting device.

FIG. 6 is a perspective view of a principal part of a light emitting device.

A light emitting device 1e includes a silicon (Si) base 62 in the form of a chip. In the silicon base 62, a recessed portion 62h and another recessed portion 62ha adjacent to the recessed portion 62h are formed. On surfaces of the silicon base 62 and the recessed portions 62h and 62ha, an insulating film 62a is formed. In the recessed portion 62h, the semiconductor laser 40 is mounted. The bottom surfaces of the recessed portions 62h and 62ha are formed, and tapered side surfaces approximately parallel to the {100} plane of the silicon are formed from the bottom surfaces to the front surface of the silicon base 62. The side surfaces are {111} planes of the silicon. Further, total reflection films may be formed on the side surfaces of the recessed portion 62h. The reason for providing the above-described recessed portion 62h in the silicon base 62 is to facilitate the upward reflection of laser light as in the aforementioned light emitting device 1b.

In the light emitting device 1e, a surface electrode 80a is formed from the bottom surface of the recessed portion 62h, through the side surface of the recessed portion 62h, the front surface of the silicon base 62, and the side surface of the recessed portion 62ha that is adjacent to the recessed portion 62h, to the bottom surface of the recessed portion 62ha, which are covered with the insulating film 62a. The surface electrode 80a is electrically continuous with a side electrode 80w formed on a side surface of the light emitting device 1e. A surface electrode of the semiconductor laser 40 and the surface electrode 80a are electrically connected to each other through a metal wire 40w.

In the light emitting device 1e, a fluorescent material (fluorescent material plate) 50C in the form of a plate is fixed to the insulating film 62a formed on surfaces such as the surface of the silicon base 62. Thus, the semiconductor laser 40, the surface electrode 80a, and the metal wire 40w are encapsulated by the fluorescent material 50C. In other words, the semiconductor laser 40 and the like are encapsulated in the space 90. Further, the fluorescent material 50C is made of a material such as described for the fluorescent material 50A.

In the light emitting device 1e, a backside electrode 80b electrically continuous with a backside electrode of the semiconductor laser 40 is formed on the back side of the light emitting device 1e.

In the light emitting device 1e, to ensure insulation between the side electrode 80w and the backside electrode 80*b*, for example, an insulating film (not shown) is also formed between the side electrode 80*w* and the silicon base 62.

The base of the light emitting device 1*e* may be made of other semiconductor material than the above-described silicon base 62.

Next, a method for manufacturing the light emitting device 1*e* will be described.

FIGS. 7A to 10B are principal-part views for explaining a method for manufacturing a light emitting device. It should be noted that each of FIGS. 7A to 7C, 9B, and 10A used as examples in the description below shows a plan view of a principal part of the light emitting device in one of the stages of the manufacturing process, and each of FIGS. 8A and 8B, 9A, and 10B shows a cross-sectional view of a principal part of the light emitting device in one of the stages of the manufacturing process.

Figure 7A:
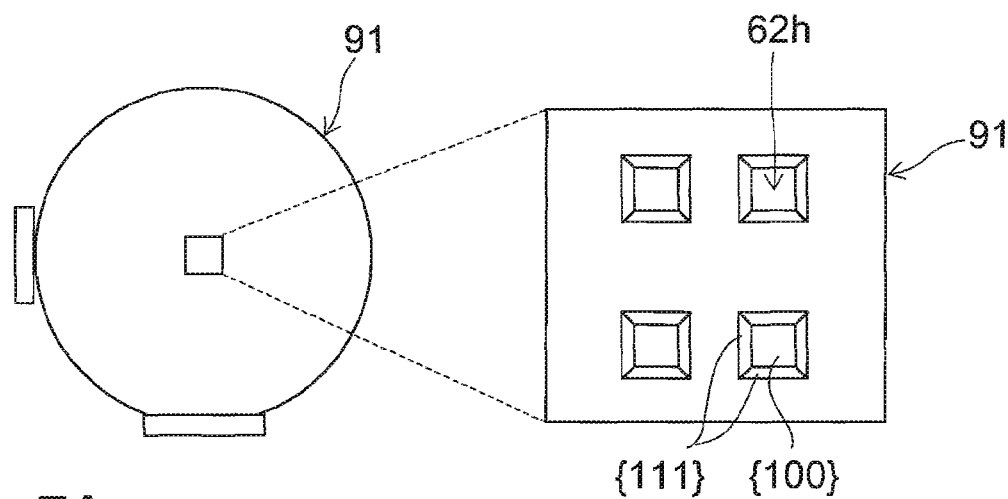
FIGS. 7A to 7C are principal-part views for explaining a method for manufacturing a light emitting device.

First, as shown in FIG. 7A, a mask material (not shown), for example, a silicon oxide ($SiO_2$) film or the like, is formed on a silicon wafer (Si wafer) 91, of which main surface is a {100} plane. Then, multiple recessed portions 62*h* are formed in the main surface of the silicon wafer 91 by etching. The silicon wafer 91 is a semiconductor substrate in the form of a wafer before being processed (cut) into silicon bases 62 such as described previously. The etching is performed by we etching using a potassium hydroxide (KOH) solution as in the case of the aforementioned light emitting device 1*b*. The bottom surface of each formed recessed portion 62*h* is a {100} plane of the silicon, and tapered side surfaces thereof are formed in {111} planes.

Figure 7B:
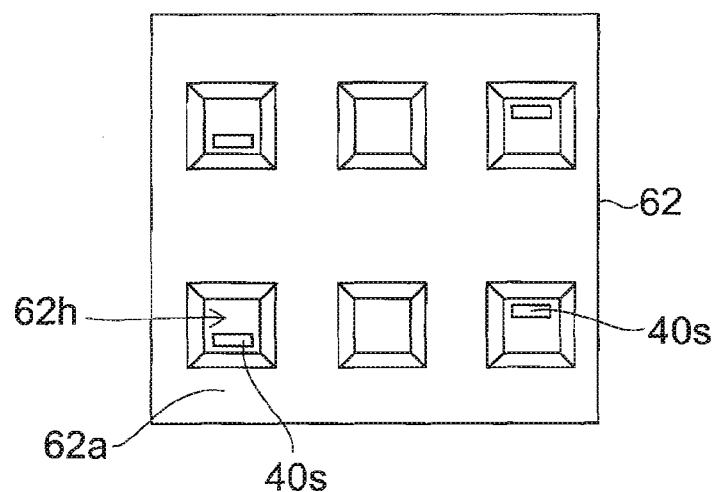

Next, as shown in FIG. 7B, an insulating film 62*a* such as a silicon oxide film is formed by a we process or the like on main surfaces (front and back surfaces) of the silicon wafer 91 having the recessed portions 62*h* formed therein. Then, in regions (not shown) for forming the backside electrodes 80*b* of light emitting devices 1*e* and semiconductor laser-mounting regions 40*s* for semiconductor lasers 40, the insulating film 62*a* is removed by photolithography to expose the silicon surface. The etching of the insulating film 62*a* at this time is performed using, for example, a hydrofluoric acid solution. Further, on the back surface of the silicon wafer 91, backside electrodes 80*b* are selectively formed in the regions where the silicon surface is exposed.

Figure 7C:
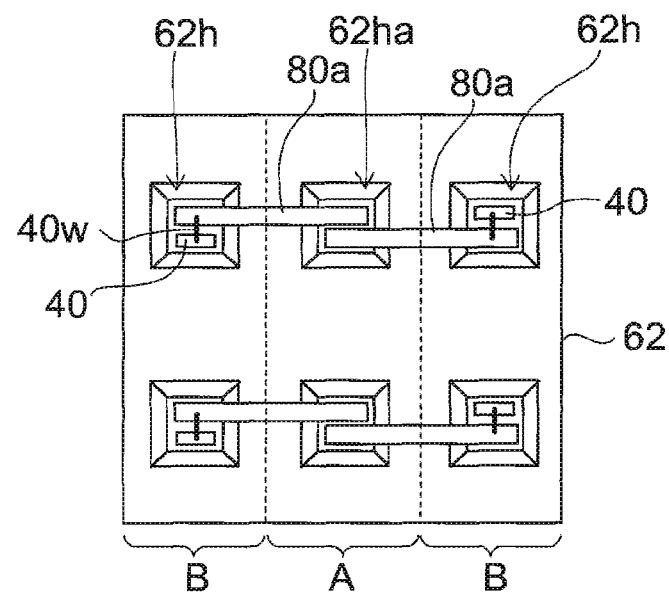

Next, to pattern surface electrodes 80*a* on the insulating film 62*a*, a resist is applied to the surface of the insulating film 62*a* to be patterned for the surface electrodes 80*a*. Then, a metal coating consisting primarily of, for example, gold (Au) or the like is formed on the resist and the insulating film 62*a*. The metal coating is formed by, for example, a sputtering or Vacuum evaporation method. Subsequently, the resist and the like are removed by liftoff to form the surface electrodes 80*a* on the insulating film 62*a*. This state is shown in FIG. 7C. Further, the back surfaces of the semiconductor lasers 40 are bonded to the semiconductor laser-mounting regions 40*s* using a solder material (e.g., lead-free solder, eutectic solder, or the like). Thus, the surface electrodes of the semiconductor lasers 40 and the backside electrodes 80*b* are electrically connected to each other.

It should be noted that at this stage, as shown in FIG. 7C, no semiconductor lasers 40 are mounted in the recessed portions 62*ha* of a column A, but the semiconductor lasers 40 are mounted in the recessed portions 62*h* of columns B that are located on both sides of the column A. Specifically, sets of columns, each of which includes a column B having the semiconductor lasers 40 mounted therein, a column A having no semiconductor lasers 40 mounted therein, and a column B having the semiconductor lasers 40 mounted therein, are periodically formed on the silicon wafer 91. Each of the surface electrodes 80*a* extends from a recessed portion 62*h* on which a semiconductor laser 40 is mounted, to a recessed portion 62*ha* on which no semiconductor laser 40 is mounted. Further, electrodes provided on the front sides of the semiconductor lasers 40 are electrically connected to the surface electrodes 80*a*, respectively, through metal wires 40*w* made of, for example, gold (Au) (see FIG. 7C).

Next, the fluorescent material 50C, which is before being cut into fluorescent materials 50C such as described previously and in the form of a plate, is bonded to a predetermined region of the silicon wafer 91.

Figure 8A:
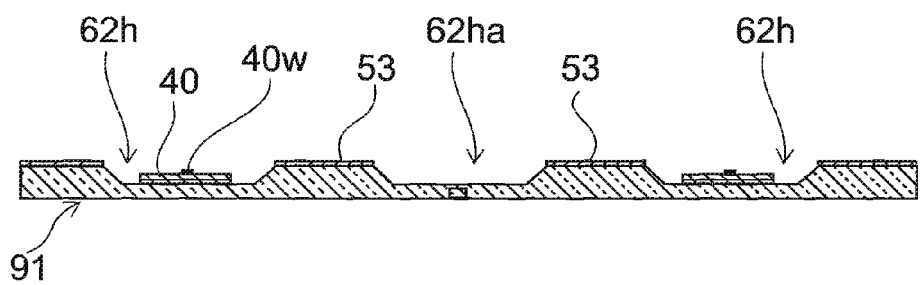
FIGS. 8A and 8B are principal-part views for explaining a method for manufacturing a light emitting device.

For example, as shown in FIG. 8A, a fritted glass 53 as an adhesive is placed on the insulating film 62*a* in regions other than the recessed portions 62*h* and 62*ha*. Thereafter, the degas of the fritted glass 53 is performed in a furnace.

Figure 8B:
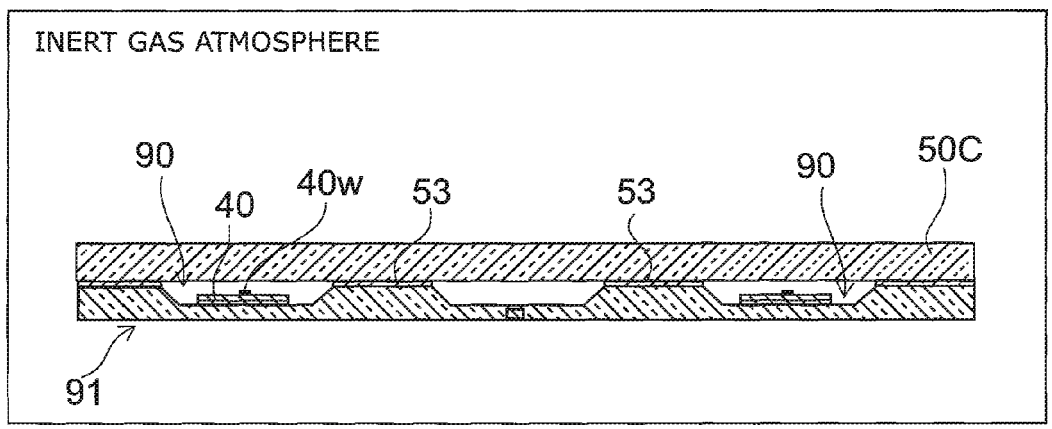

Next, as shown in FIG. 8B, the fluorescent material 50C in the form of a plate is placed face down on the silicon wafer 91 with the fritted glass 53 interposed therebetween.

Subsequently, the fluorescent material 50C in the form of a plate, the silicon wafer 91, and the like are placed in a vacuum chamber, and the pressure is reduced to approximately $10^{-4}$ Pa. Then, the vacuum chamber is filled with an inert gas. Further, after the fluorescent material 50C in the form of a plate and the silicon wafer 91 are aligned with each other, the fluorescent material 50C in the form of a plate and the silicon wafer 91 are brought into intimate contact with each other to be heated at 450° C. for one minute with a pressure of, for example, 1 kg/cm². Thus, the fluorescent material 50C in the form of a plate and the silicon wafer 91 are bonded to each other.

Figure 9A:
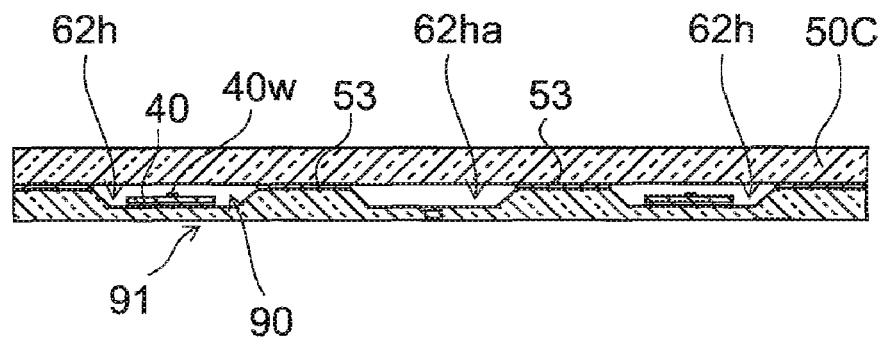
FIGS. 9A and 9B are principal-part views for explaining a method for manufacturing a light emitting device.
Figure 9B:
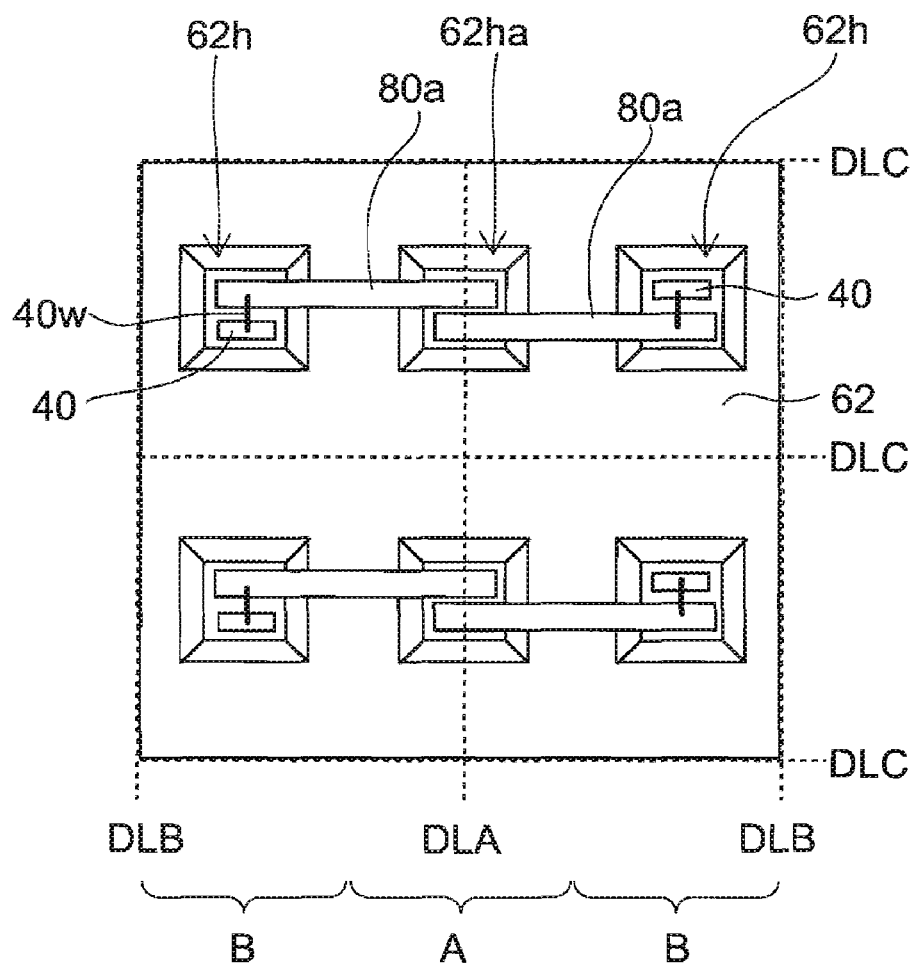

Next, as shown in FIGS. 9A and 9B, the fluorescent material 50C, the silicon wafer 91, and the like are cut along dicing lines indicated by broken lines by a dicer (not shown). The dicing lines include lines DLA, each of which divides a column A into two portions, and lines DLB for cutting between columns B. The lines DLA and DLB are approximately perpendicular to the surface electrodes 80*a*. Eventually, the fluorescent material 50C in the form of a plate and the silicon wafer 91 are divided into chips by performing dicing along lines DLC (lines, which are approximately parallel and adjacent to the surface electrodes 80*a* and which are between the semiconductor lasers 40) approximately perpendicular to the lines DLA and DLB. Nevertheless, the following processes are performed in this embodiment before the cutting along the lines DLC (before the light emitting devices 1*e* in the form of a chip shown in FIG. 6 are obtained).

Figure 10A:
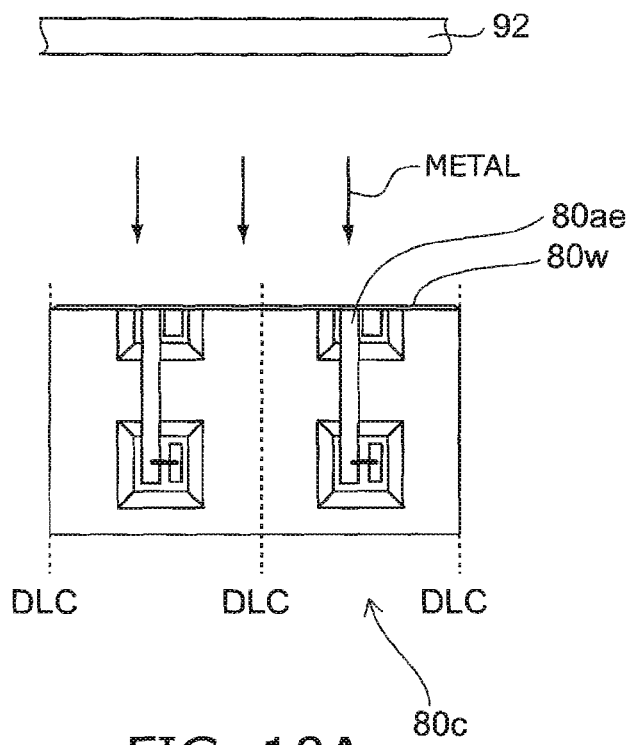
FIGS. 10A and 10B are principal-part views for explaining a method for manufacturing a light emitting device.
Figure 10B:
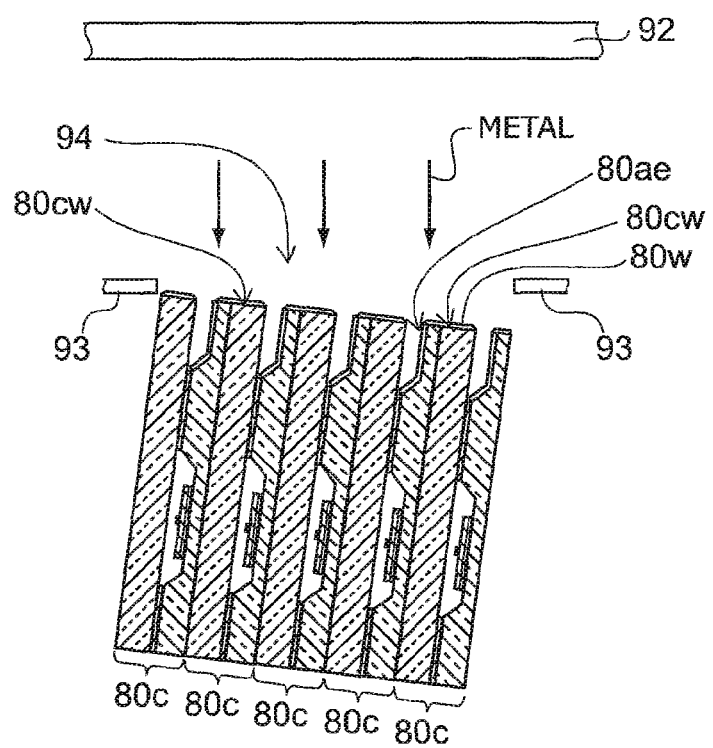

As shown in FIGS. 10A and 10B, a side electrode 80*w* is formed on a side surface (cut surface) of each of chip bodies 80*c* in the form of a strip after the cutting along the lines DLA and DLB.

For example, an insulating film is formed on a side surface 80*cw* of the chip body 80*c*, and then a stack of several chip bodies 80*c* is placed to face a metal target 92 such as gold (Au). The side electrodes 80*w* are formed on the side surfaces 80*cw* of the chip bodies 80*c* by a Vacuum evaporation method. At this time, the chip bodies 80*c* are placed such that the side surfaces 80*cw* of the stacked chip bodies 80*c* are not parallel to a surface of the metal target 92. When the side electrodes 80*w* are formed, an evaporation mask 93 is used to prevent a film from being formed in regions (e.g., back and front surfaces) other than the side surfaces 80*cw* of the chip bodies 80*c*. For example, the side electrodes 80*w* are formed on at least part of the side surfaces 80*cw* of the chip bodies 80*c* by so-called oblique deposition in which only the side surfaces 80cw of the chip bodies 80c are exposed through an opening portion 94 of the evaporation mask 93 as shown in FIG. 10B.

By such oblique deposition, the side electrodes 80w are formed on the side surfaces 80cw of the chip bodies 80c, and, at the same time, end portions 80ae of the surface electrodes 80a are also coated with the metal. Thus, the surface electrodes 80a and the side electrodes 80w become electrically continuous with each other.

It should be noted that, since insulating films are formed as underlying layers of the side electrodes 80w, insulation is ensured between the surface electrodes 80a (or side electrodes 80w) and the backside electrodes 80b.

When the side electrodes 80w are formed, the portions other than the surface electrodes 80a and the side surfaces 80cw of the chip bodies 80c may be masked with a resist or the like instead of using the above-described evaporation mask 93.

After that, by dicing each of the chip bodies 80c along the lines DLC, the fluorescent material 50C and the silicon wafer 91 in the form of a strip is divided into individual semiconductor lasers 40. Thus, the light emitting device 1e in the form of a chip shown in FIG. 6 is formed.

In the above-described light emitting device 1e, since the fluorescent material 50C is made of a crystal or glass as the fluorescent material 50A is, the fluorescent material 50C hardly emits impurity gas into the space 90 even when the laser light is irradiated to the fluorescent material 50C. Thus, the semiconductor laser 40 in the light emitting device 1e is also less prone to degradation. Accordingly, the light emitting device 1e also has a high luminous efficiency and high reliability. In particular, since laser light emitted from two opposite sides of the semiconductor laser 40 is reflected by side surfaces ({111} planes) of the recessed portion 62h provided directly in the silicon base 62, the laser light can be efficiently irradiated to the fluorescent material 50C. Thus, the luminous efficiency is improved.

Further, in the light emitting device 1e, since the semiconductor laser 40 can be mounted in the recessed portion 62h provided directly in the silicon base 62, the surface mounting of the semiconductor laser 40 becomes feasible. Thus, a thinned (miniaturized) light emitting device can be fabricated.

Moreover, the light emitting device 1e in the form of a chip is formed by bonding the fluorescent material 50C in the form of a plate and the silicon wafer 91 together and dicing the fluorescent material 50C and the silicon wafer 91 at the same time. Accordingly, the process for fabricating the light emitting device 1e is simplified, and the manufacturability thereof is improved.

Embodiments of the invention have been described above with reference to specific examples. However, embodiments of the invention are not limited to these specific examples. Specifically, any light emitting devices obtained by making appropriate design modifications to the above-described specific examples by those skilled in the art are also included in the scope of the invention as long as the modified light emitting devices have features of the invention. For example, each component of each of the above-described specific examples and the position, material, conditions, shape, size, and the like of the component are not limited to those shown as examples, but may be appropriately changed.

Moreover, components of the above-described embodiments can be combined when technically feasible, and combinations of such components are also included in the scope of the invention as long as the combinations have features of the invention.

Also, within the scope of principles of the invention, various variations and modifications, which will occur to those skilled in the art, also fall within the scope of the invention.

The invention claimed is:

1. A light emitting device, comprising:
   a casing;
   a window including a nonreflective layer;
   a semiconductor laser provided in an enclosed space formed by the casing and the window; and
   a fluorescent material in a form of any one of a crystal and glass, the fluorescent material being provided in the enclosed space,
   the fluorescent material absorbing laser light emitted from the semiconductor laser and emitting secondary light having a wavelength different from a wavelength of the laser light, and
   the secondary light being taken out through the window.

2. The device according to claim 1, further comprising a semiconductor base material provided in the enclosed space, the semiconductor base material having a bottom surface and a side surface, at least part of the side surface being a mirror portion,
   the semiconductor laser being mounted on the bottom surface of the semiconductor base material, and
   the laser light emitted from the semiconductor laser and reflected by the mirror portion being absorbed by the fluorescent material.

3. The device according to claim 2, the bottom surface of the semiconductor base material is a bottom surface of a recessed portion of the semiconductor base material, the mirror portion is a surface of a total reflection layer provided on a side surface of the recessed portion and reflects the laser light emitted from an end of the semiconductor laser.

4. The device according to claim 1, wherein the enclosed space is an inert gas atmosphere.

* * * * *